United States Patent
Okada et al.

(10) Patent No.: US 8,981,805 B2
(45) Date of Patent: Mar. 17, 2015

(54) INSPECTION APPARATUS AND INSPECTION METHOD

(71) Applicants: Akira Okada, Tokyo (JP); Hajime Akiyama, Tokyo (JP); Kinya Yamashita, Tokyo (JP)

(72) Inventors: Akira Okada, Tokyo (JP); Hajime Akiyama, Tokyo (JP); Kinya Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 126 days.

(21) Appl. No.: 13/783,060

(22) Filed: Mar. 1, 2013

(65) Prior Publication Data

US 2013/0321015 A1 Dec. 5, 2013

(30) Foreign Application Priority Data

Jun. 4, 2012 (JP) ................................. 2012-127192

(51) Int. Cl.
*G01R 1/067* (2006.01)
*G01R 31/28* (2006.01)

(52) U.S. Cl.
CPC ............ *G01R 1/06711* (2013.01); *G01R 1/067* (2013.01); *G01R 31/2863* (2013.01)
USPC ............ 324/755.11; 324/756.01; 324/756.04; 324/755.01

(58) Field of Classification Search
CPC .......... G01R 1/07314; G01R 31/2891; G01R 31/2852; G01R 31/2863; G01R 3/00
USPC ............. 324/750.01, 750.03, 754.01–754.26, 324/755.01–758.01
See application file for complete search history.

(56) References Cited

U.S. PATENT DOCUMENTS

| | | |
|---|---|---|
| 2003/0160624 A1 | 8/2003 | Takemoto et al. |
| 2004/0046580 A1 | 3/2004 | Takemoto et al. |
| 2006/0255814 A1 | 11/2006 | Eldridge et al. |
| 2007/0001692 A1 | 1/2007 | Yamada |
| 2008/0042668 A1 | 2/2008 | Eldridge et al. |
| 2009/0224788 A1* | 9/2009 | Sasajima et al. .............. 324/758 |
| 2010/0000080 A1 | 1/2010 | Eldridge et al. |
| 2010/0007365 A1 | 1/2010 | Ishizuka et al. |

(Continued)

FOREIGN PATENT DOCUMENTS

| | | |
|---|---|---|
| JP | S60-79740 U | 6/1985 |
| JP | H02-069682 A | 3/1990 |

(Continued)

OTHER PUBLICATIONS

Uenishi Takao (Inventor). Tokyo Electron Ltd (Assignee). JP 7066252 A. (Published Mar. 10, 1995). [English Machine Translation].*

(Continued)

*Primary Examiner* — Tung X Nguyen
*Assistant Examiner* — Alesa Allgood
(74) *Attorney, Agent, or Firm* — Studebaker & Brackett PC

(57) ABSTRACT

An inspection apparatus includes an insulating substrate, a probe pin having a body portion secured to the insulating substrate, a tip portion connected to one end of the body portion and disposed on the back surface side of the insulating substrate, and a connection portion connected to the other end of the body portion and disposed on the front surface side of the insulating substrate, and a heat-radiating terminal in contact with the connection portion, wherein a current is applied through the heat-radiating terminal and the probe pin to an object to measured, and wherein the heat-radiating terminal discharges heat from the probe pin.

12 Claims, 7 Drawing Sheets

(56) References Cited

U.S. PATENT DOCUMENTS

| | | | |
|---|---|---|---|
| 2011/0241711 A1 | 10/2011 | Teich et al. | |
| 2014/0015554 A1* | 1/2014 | Okada et al. | 324/750.01 |

FOREIGN PATENT DOCUMENTS

| | | |
|---|---|---|
| JP | H10-3973 A | 1/1998 |
| JP | 10-070361 A | 3/1998 |
| JP | 11-074321 A | 3/1999 |
| JP | 2001-153886 A | 6/2001 |
| JP | 2004-150999 A | 5/2004 |
| JP | 2007-012475 A | 1/2007 |
| JP | 2008-111719 A | 5/2008 |
| JP | 2008-539394 A | 11/2008 |
| JP | 2009-031059 A | 2/2009 |
| JP | 2010-019797 A | 1/2010 |
| JP | 2011-038831 A | 2/2011 |
| JP | 2012-503304 A | 2/2012 |
| JP | 2012-047503 A | 3/2012 |
| WO | 2010/028914 A1 | 3/2010 |

OTHER PUBLICATIONS

An Office Action; "Notification of Reason for Rejection," issued by the Japanese Patent Office on Sep. 16, 2014, which corresponds to Japanese Patent Application No. 2012-127192 and is related to U.S. Appl. No. 13/783,060; with English language partial translation.

* cited by examiner

INSPECTION APPARATUS AND INSPECTION METHOD

BACKGROUND OF THE INVENTION

1. Field of the Invention

The present invention relates to an inspection apparatus and inspection method used for inspecting the electrical characteristics of an object to be measured.

2. Background Art

It is known practice to inspect the electrical characteristics of a heated object to be measured by bringing a probe pin into contact with the object. The probe pin is typically secured to an insulating substrate. Japanese Laid-Open Patent Publication No. 2012-47503 discloses a technique for varying the temperature of a probe substrate (or insulating substrate) in accordance with changes in the temperature of the object to be measured. This technique directly heats the insulating substrate to the desired temperature. Published Japanese Translation of PCT Application No. 2012-503304 discloses a technique for supplying a temperature-controlled gas flow to within an inspection apparatus so as to regulate the temperature of the insulating substrate to the desired temperature.

The technique disclosed in the above Patent Publication No. 2012-97503 is disadvantageous in that the insulating substrate may expand or warp due to the heat applied to the substrate. The expansion or warpage of the insulating substrate results in displacement of the probe pin attached to the insulating substrate, making it impossible to bring the probe pin into contact with the desired point on the object to be measured and press the probe pin against the object with the desired pressure. Further, heat is transferred from the heated object to be measured to the insulating substrate through the probe pin, thereby causing the insulating substrate to expand or warp.

The technique disclosed in the above Published Japanese Translation of PCT Application No. 2012-503304, on the other hand, can be used to maintain the insulating substrate at, e.g., approximately room temperature. However, a complicated apparatus and considerable electric energy are required to supply a temperature-controlled gas flow.

SUMMARY OF THE INVENTION

The present invention has been made to solve the above problems. It is, therefore, an object of the present invention to provide an inspection apparatus and an inspection method which prevent the expansion and warpage of the insulating substrate by using a simple method.

The features and advantages of the present invention may be summarized as follows.

According to one aspect of the present invention, an inspection apparatus includes an insulating substrate, a probe pin having a body portion secured to the insulating substrate, a tip portion connected to one end of the body portion and disposed on the back surface side of the insulating substrate, and a connection portion connected to the other end of the body portion and disposed on the front surface side of the insulating substrate, and a heat-radiating terminal in contact with the connection portion, wherein a current is applied through the heat-radiating terminal and the probe pin to an object to measured, and wherein the heat-radiating terminal discharges heat from the probe pin.

According to another aspect of the present invention, a method of inspection includes a first preparation step of bringing a tip portion of a probe pin into contact with a first object to be measured and bringing a heat-radiating terminal into contact with a connection portion of the probe pin, the probe pin having a body portion secured to an insulating substrate, the tip portion being connected to one end of the body portion and disposed on the back surface side of the insulating substrate, the connection portion being connected to the other end of the body portion and disposed on the front surface side of the insulating substrate, a first inspection step of, after the first preparation step, inspecting electrical characteristics of the first object to be measured by applying a current to the first object through the probe pin and the heat-radiating terminal while heating the first object, a separation step of, after the first inspection step, separating the tip portion from the first object to be measured and separating the heat-radiating terminal from the connection portion so as to cool the heat-radiating terminal, a second preparation step of, after the separation step, bringing the tip portion into contact with the first object to be measured or a second object to be measured and bringing the heat-radiating terminal into contact with the connection portion, and a second inspection step of, after the second preparation step, inspecting electrical characteristics of the first or second object to be measured by applying a current to the first or second object through the probe pin and the heat-radiating terminal while heating the first or second object.

According to another aspect of the present invention, a method of inspection includes a preparation step of bringing a tip portion of a probe pin into contact with a first object to be measured and bringing a heat-radiating terminal into contact with a connection portion of the probe pin, the probe pin having a body portion secured to an insulating substrate, the tip portion being connected to one end of the body portion and disposed on the back surface side of the insulating substrate, the connection portion being connected to the other end of the body portion and disposed on the front surface side of the insulating substrate, a first inspection step of, after the preparation step, inspecting electrical characteristics of the first object to be measured by applying a current to the first object through the probe pin and the heat-radiating terminal while heating the first object, a replacement step of, after the first inspection step, replacing the heat-radiating terminal with a replacement heat-radiating terminal, and a second inspection step of, after the replacement step, inspecting electrical characteristics of the first object to be measured or a second object to be measured by applying a current to the first or second object through the probe pin and the replacement heat-radiating terminal while heating the first or second object.

Other and further objects, features and advantages of the invention will appear more fully from the following description.

DETAILED DESCRIPTION OF THE PREFERRED EMBODIMENTS

First Embodiment

Figure 1:
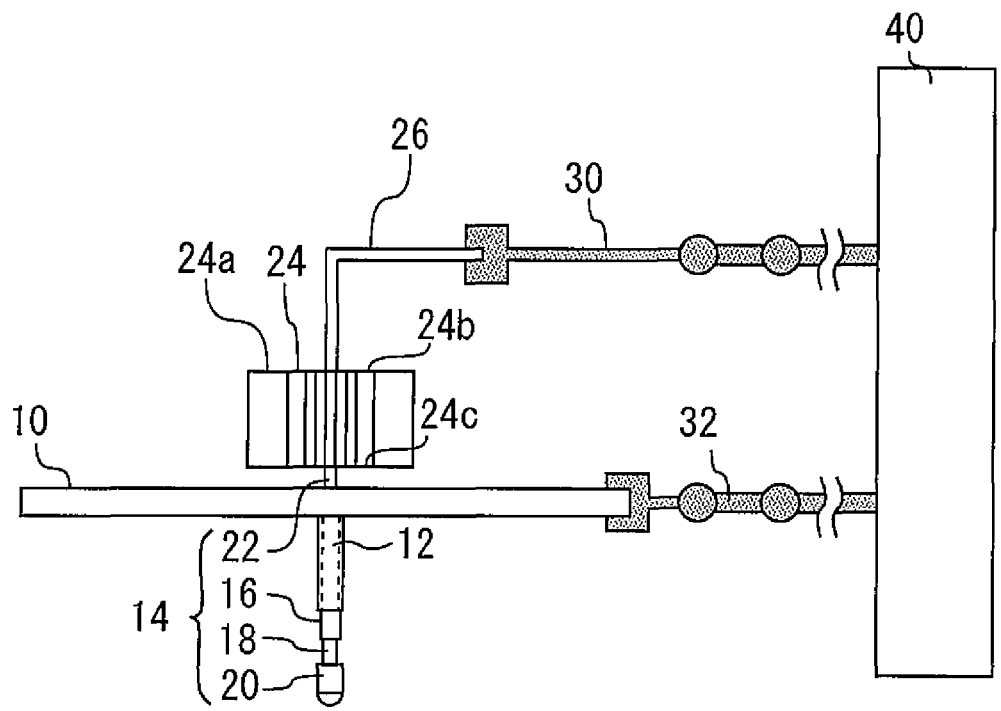
FIG. 1 is an elevational view of an inspection apparatus in accordance with a first embodiment of the present invention.

FIG. 1 is an elevational view of an inspection apparatus in accordance with a first embodiment of the present invention. The inspection apparatus includes an insulating substrate 10 formed of, e.g., ceramic or glass epoxy material. A socket 12 is secured to the insulating substrate 10, e.g., by means of crimping. A probe pin 14 is fit into the socket 12 so as to penetrate through the insulating substrate 10.

The probe pin 14 will be described. The probe pin 14 has a body portion 16. The body portion 16 is fit into the socket 12 and secured to the insulating substrate 10. A tip portion 20 is connected via an extensible portion 18 to one end of the body portion 16. The extensible portion 18 has a spring member therein and can be extended and retracted in the axial direction of the probe pin 14. The probe pin 14 is pressed in that direction. The tip portion 20 is disposed on the back surface side of the insulating substrate 10. The tip portion 20 is rounded. A connection portion 22 is connected to the other end of the body portion 16. The connection portion 22 is disposed on the front surface side of the insulating substrate 10.

The probe pin 14 is formed of metal material such as, e.g., copper, tungsten, or rhenium tungsten. Further, the probe pin 14 is preferably coated, e.g., with gold, palladium, tantalum, or platinum, etc. in order to enhance its conductivity and durability.

A heat-radiating terminal 24 is in contact with the probe pin 14. The heat-radiating terminal 24 is formed of metal material having heat tolerance and heat and electrical conductivity, such as, e.g., aluminum or copper. The heat-radiating terminal 24 has a larger volume than the probe pin 14. The heat-radiating terminal 24 is provided with radiating fins 24a. The heat-radiating terminal 24 has an upper surface 24b and a lower surface 24c. A current carrying member 26 is secured to the center of the upper surface 24b. The current carrying member 26 is formed of a metal bar. The connection portion 22 is in surface contact with the center portion of the lower surface 24c.

Figure 2:
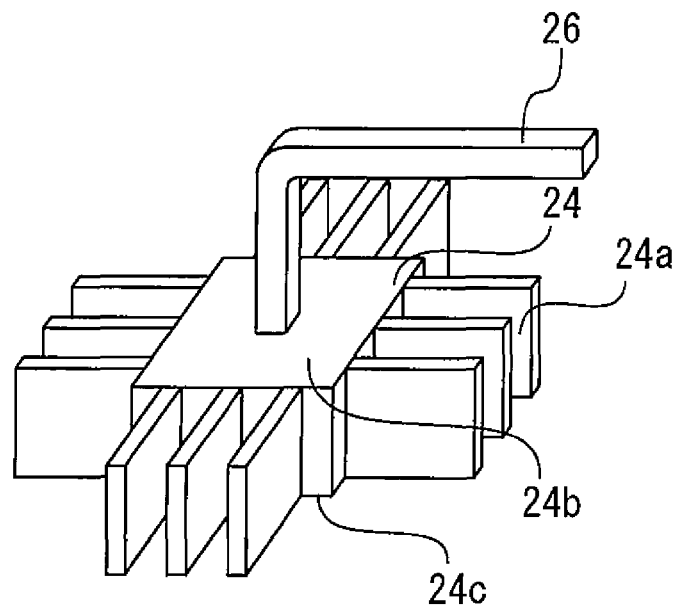
FIG. 2 is a perspective view of the heat-radiating terminal and the current carrying member.

FIG. 2 is a perspective view of the heat-radiating terminal and the current carrying member. FIG. 2 shows that the current carrying portion 26 is secured to the center of the upper surface 24b of the heat-radiating terminal 24. Referring back to FIG. 1, the inspection apparatus of the first embodiment includes a first arm 30. The first arm 30 is used to hold and move the current carrying member 26.

Figure 3:
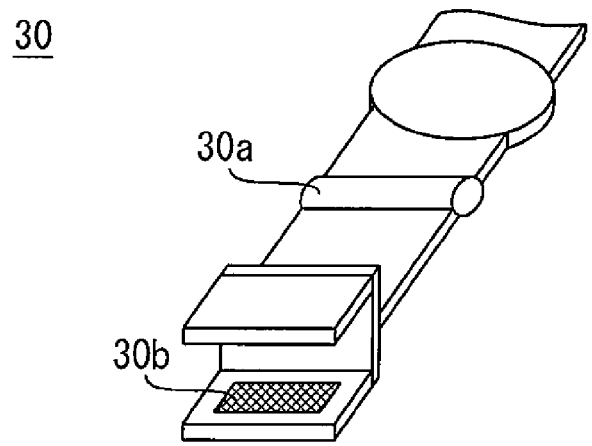
FIG. 3 is a perspective view of the first arm.

FIG. 3 is a perspective view of the first arm. The first arm 30 has a plurality of joints 30a and can be moved in any direction. Further, an electrically conductive portion 30b is formed at the tip of the first arm 30. The electrically conductive portion 30b is formed at a position where it will come into contact with the current carrying member 26 when the current carrying member 26 is held by the first arm 30.

Referring back to FIG. 1, the inspection apparatus of the first embodiment includes a second arm 32. The second arm 32 is used to hold and move the insulating substrate 10. The first arm 30 and the second arm 32 are controlled by a control unit 40. The control unit 40 is used to control the first arm 30 and the second arm 32 and apply a current to the first arm 30. The control unit 90 at least functions to control the first arm 30 and the second arm 32 so that the heat-radiating terminal 24 and the connection portion 22 are brought into and out of contact with each other.

Figure 4:
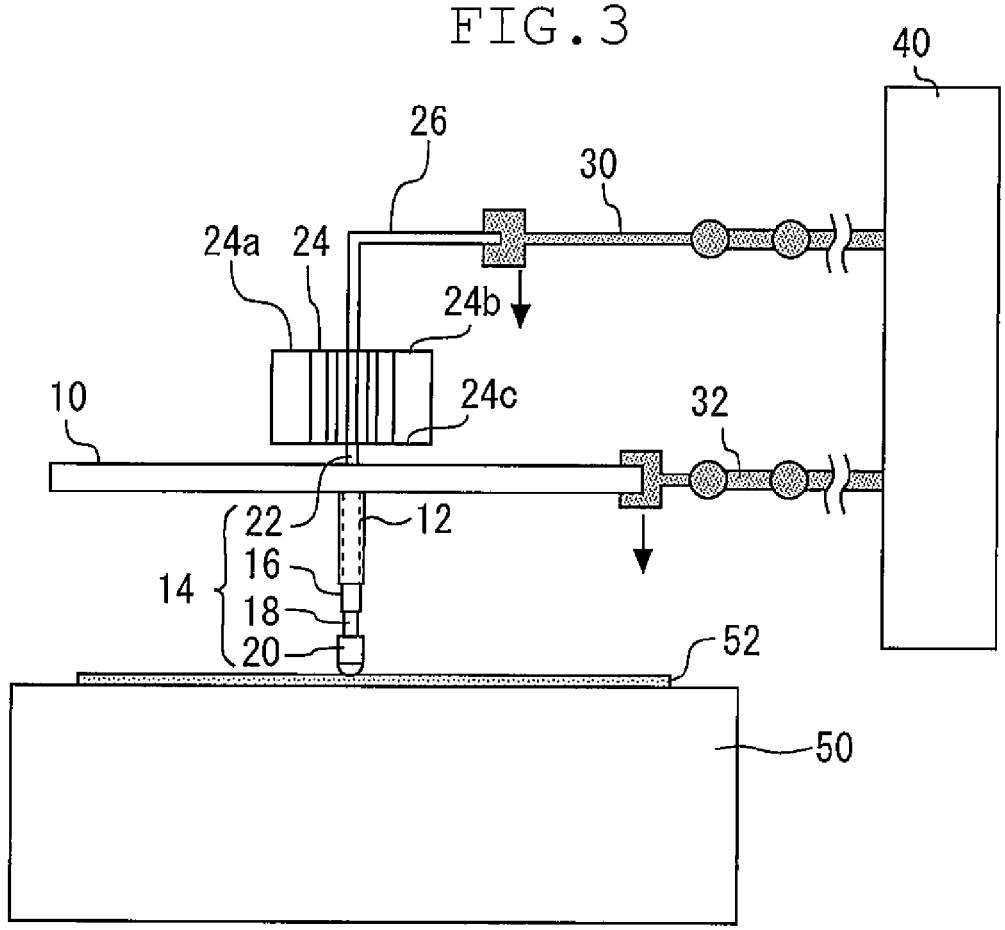
FIG. 4 is an elevational view showing the movement of the first and second arms in a first preparation step.

An inspection method using the inspection apparatus of the present invention will now be described. FIG. 4 is an elevational view showing the movement of the first and second arms in a first preparation step. First, the control unit 40 controls the first arm 30 and the second arm 32 so that the tip portion 20 of the probe pin 14 is brought into contact with the object 52 to be measured and the lower surface 24c of the heat-radiating terminal 24 is brought into contact with the connection portion 22. This step is referred to herein as the first preparation step. The object 52 to be measured is mounted on a stage 50. The stage 50 has a heater embedded therein for heating the object 52 to be measured. The object 52 to be measured may be, e.g., a wafer having a plurality of IGBTs formed therein. The object 52 to be measured is held onto the stage 50 by means of suction or electrostatic force.

Next, the electrical characteristics of the object 52 to be measured are inspected by applying a current to the object 52 through the probe pin 14 and the heat-radiating terminal 24 while heating the object 52 by means of the heater 52 of the stage 50. This step is referred to herein as the first inspection step. The current applied to the object 52 to be measured is supplied from the control unit 40 to the object 52 through the first arm 30 (which is provided with the electrically conductive portion 30b), the current carrying member 26, the heat-radiating terminal 24, and the probe pin 14. Further, other characteristics of the object 52 to be measured may also be inspected while the current is controlled by the control unit 40.

Figure 5:
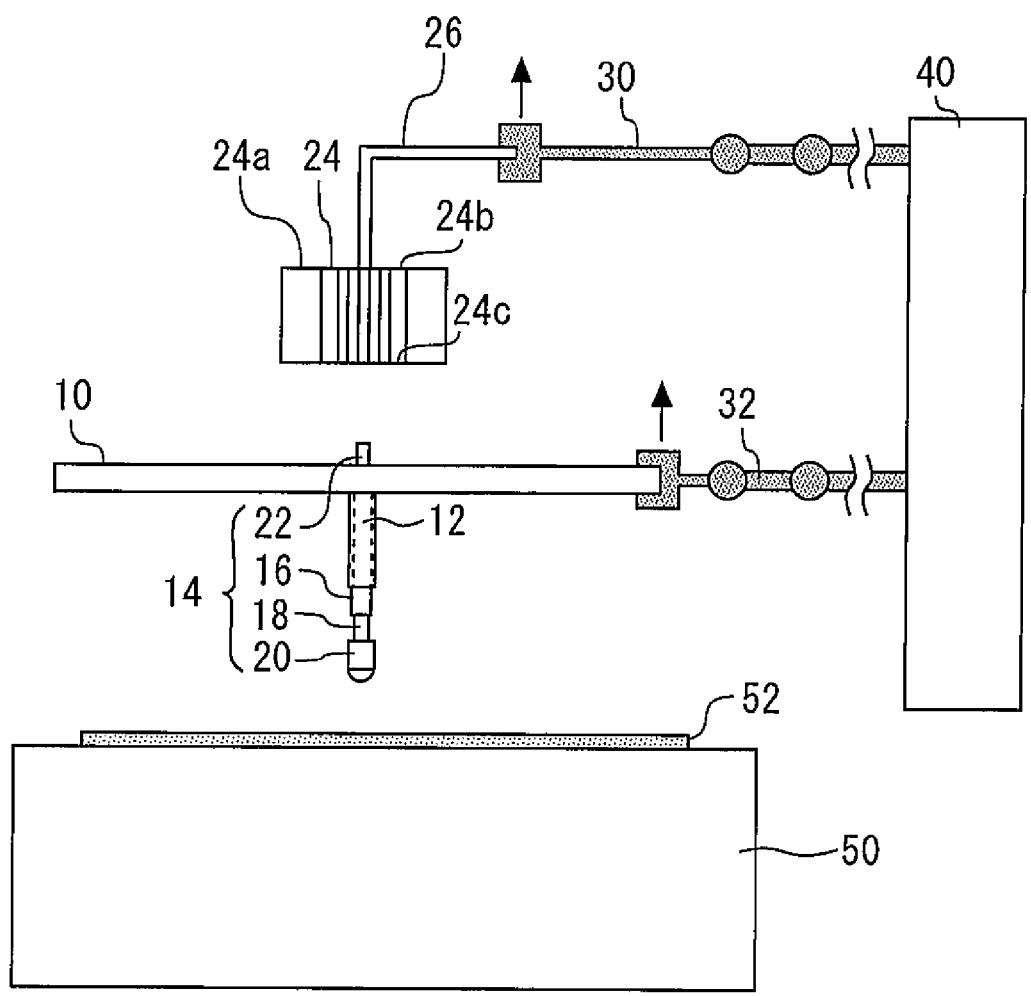
FIG. 5 is an elevational view showing the movement of the first and second arms in a separation step.

FIG. 5 is an elevational view showing the movement of the first and second arms in a separation step. After the first inspection step, the tip portion 20 is separated from the object 52 to be measured and the heat-radiating terminal 24 is separated from the connection portion 22, thereby cooling the probe pin 14 and the heat-radiating terminal 24. This step is referred to herein as the separation step. The first arm 30 is used to move the heat-radiating terminal 24 upward so as to separate it from the connection portion 22. The second arm 32 is used to move the insulating substrate 10 upward so as to separate the tip portion 20 from the object 52 to be measured. A predetermined amount of time is then waited. In this way, the probe pin 14 and the heat-radiating terminal 24 are separately cooled while avoiding the transfer of heat from the object 52 to be measured to the probe pin 14.

Then as in the first preparation step, the tip portion 20 is brought into contact with the object 52 to be measured, and the heat-radiating terminal 24 is brought into contact with the connection portion 22. This step is referred to herein as the second preparation step. Next, the electrical characteristics of the object 52 to be measured are inspected by applying a current to the object 52 while heating the object 52. This step is referred to herein as the second inspection step. During the separation step, the object 52 to be measured may be still maintained in a heated state in order to reduce the time required for the completion of the subsequent second inspection step. It should be noted that the object to be measured may be replaced during the separation step. That is, the first preparation step and the first inspection step may be performed when a first object to be measured is on the stage, and the second preparation step and the second inspection step may be performed when a second object to be measured is on the stage.

In the inspection apparatus of the first embodiment, the heat that has been transferred from the object 52 to be measured to the probe pin 14 can be absorbed by the heat-radiating terminal 24. This prevents heating up or overheating of the probe pin 19, thereby facilitating prevention of expansion or warpage of the insulating substrate 10 due to heat from the probe pin 19. Further, since the heat-radiating terminal 24 is formed of metal material and furthermore provided with radiating fins 24a, the heat that has been absorbed by the heat-radiating terminal 24 can be discharged to ambient environment.

It should be noted that in order to prevent heating up of the probe pin 14, it is preferable to increase the size of the heat-radiating terminal 24. In the inspection apparatus of the first embodiment, the volume of the heat-radiating terminal 24 is greater than the volume of the probe pin 19, thereby preventing heating up of the probe pin 19. In cases where the current flowing through the heat-radiating terminal 24 is high or the temperature of the object 25 to be measured is high, the probe pin 14 readily heats up. Therefore, the larger the heat-radiating terminal 24, the better. Since as shown in FIG. 1 the heat-radiating terminal 24 is disposed above the insulating substrate 10, it is possible to increase the size of the heat-radiating terminal 24 without restriction by the presence of the probe pin 14. Further, the probe pin and the insulating substrate can be of general types.

If the current density in a portion of the current path for inspection increases, or is not uniform, that portion may generate heat. In order to avoid such events, the inspection apparatus of the first embodiment is configured in such a manner that the lower surface 24c of the heat-radiating terminal 24 is in surface contact with the connection portion 22, thereby reducing the current density in the contact portion. Further, the connection portion 22 is in surface contact with the center portion of the lower surface 24c of the heat-radiating terminal 24, and the current carrying member 26 is secured to the center of the upper surface 24b of the heat-radiating terminal 24. As a result, the current flowing from the upper surface 24b to the lower surface 24c of the heat-radiating terminal 24 flows through their central portions, thereby minimizing the non-uniformity of the current density in the heat-radiating terminal 24.

Further, since the portion of the tip portion 20 which is brought into contact with the object 52 to be measured is rounded, the current density in the tip portion 20 can be reduced, as compared with cases in which the tip portion is configured as a needle. Therefore, it is possible to reduce the heat generated in the current path. It should be noted that reducing the heat generated in the tip portion 20 of the probe pin 14 prevents overheating of the object 52 to be measured, making it possible to increase the yield of the object 52.

In accordance with the inspection method of the first embodiment, after the completion of the first inspection step, the probe pin 14 and the heat-radiating terminal 24 are separately cooled in the separation step, so that the heat-radiating terminal 24 is quickly cooled and the next inspection can be readily initiated. It should be noted that the current carrying member 26 is provided to make it easy for the first arm 30 to hold and move the heat-radiating terminal 24. Therefore, if the heat-radiating terminal 24 can be easily held and moved by the first arm 30 alone, then the current carrying member 26 is not required.

Further, if the heat-radiating function of the heat-radiating terminal 24 can prevent heating up of the probe pin 14 alone, then the separation step may be omitted. In that case, the first arm 30 and the current carrying member 26 may also be omitted, since there is no need to separate the heat-radiating terminal 24 from the connection portion 22. If the first arm 30 and the current carrying member 26 are omitted, a wire for supplying a current to the heat-radiating terminal 24 may be connected to the upper surface 24b of the heat-radiating terminal 24.

Figure 6:
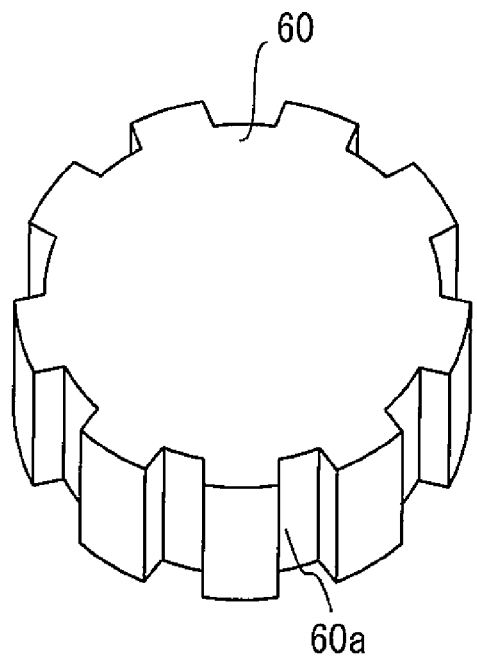
FIG. 6 is a perspective view of a variation of the heat-radiating terminal of the first embodiment.

The heat-radiating terminal 24 is not limited to the shape shown in FIG. 2, but may be cubic or cylindrical. FIG. 6 is a perspective view of a variation of the heat-radiating terminal of the first embodiment. This heat-radiating terminal, 60, has recessed portions 60a. The recessed portions 60a, like the radiating fins 24a described above, serve to increase the surface area of the heat-radiating terminal and thereby enhance its heat-radiating function. The recessed portions 60a are more suitable for space-saving than the radiating fins 24a. In addition, the heat-radiating terminal 60 can be easily manufactured by machining a round bar. It should be noted that knurling may be applied to the heat-radiating terminal, instead of forming the recessed portions 60a.

Figure 7:
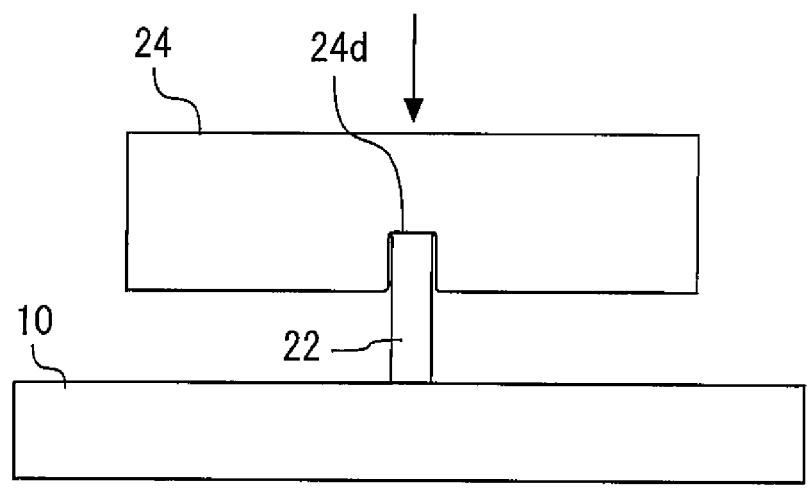
FIG. 7 is a cross-sectional view showing another variation of the heat-radiating terminal of the first embodiment.

FIG. 7 is a cross-sectional view showing another variation of the heat-radiating terminal of the first embodiment. This heat-radiating terminal, 24, has a recessed portion 24d formed therein. Further, the shape of the connection portion 22 is such that the connection portion 22 can be inserted into the recessed portion 24d of the heat-radiating terminal 24. This increases the surface of contact between the heat-radiating terminal 24 and the connection portion 22, making it possible to minimize the current density in the contact portion.

Second Embodiment

A second embodiment of the present invention provides an inspection apparatus and an inspection method which have many features common to the inspection apparatus and the inspection method of the first embodiment. Therefore, the following description of the second embodiment will be primarily limited to the differences from the first embodiment. The inspection apparatus and the inspection method of the second embodiment are characterized by replacing the heat-radiating terminal.

Figure 8:
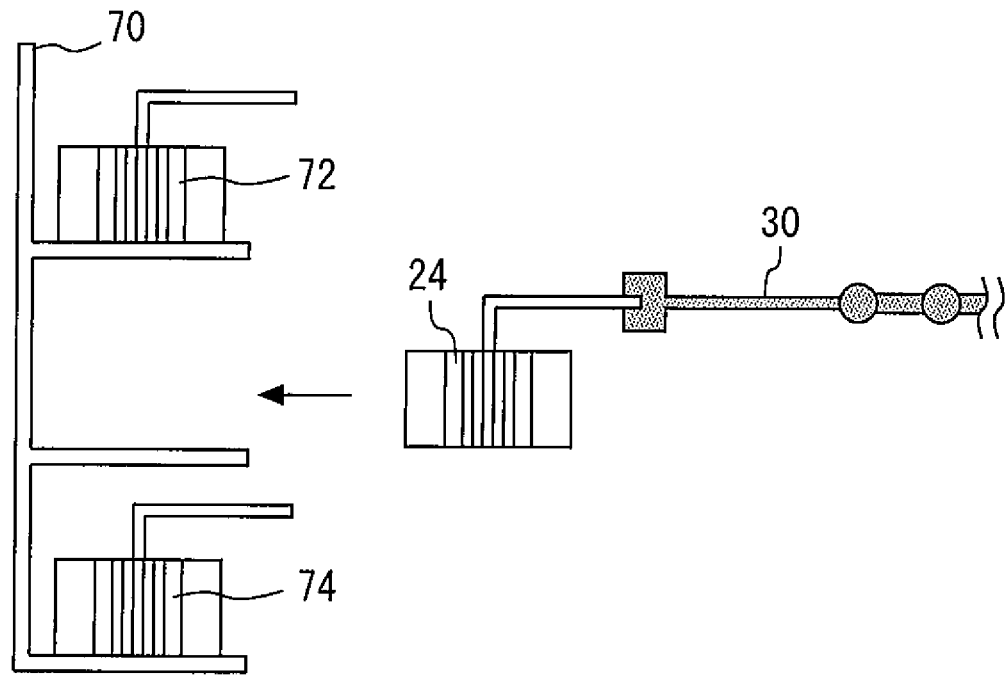
FIG. 8 is an elevational view showing the way in which the heat-radiating terminal is replaced in accordance with the inspection method of the second embodiment.

FIG. 8 is an elevational view showing the way in which the heat-radiating terminal is replaced in accordance with the inspection method of the second embodiment. A storage cabinet 70 is provided within the reach of the first arm 30. The storage cabinet 70 presently stores replacement heat-radiating terminals 72 and 74. The replacement heat-radiating terminals 72 and 74 are preferably formed of, but not limited to, the same material as the heat-radiating terminal 24, and preferably have, but are not limited to, the same shape as the heat-radiating terminal 24.

The inspection method of the second embodiment will now be described. After the first inspection step, the control unit 40 controls the first arm 30 so as to replace the heat-radiating terminal 24 with the replacement heat-radiating terminal 72. This step is referred to herein as the replacement step. During the replacement step, the tip portion 20 may be maintained in contact with the object 52 to be measured, or alternatively, they may be separated from each other.

Next, the electrical characteristics of the object 52 to be measured are inspected by applying a current to the object 52 from the control unit 40 while heating the object 52. This is the second inspection step. If the tip portion 20 is separated from the object 52 during the replacement step, then the tip portion 20 must be brought into contact with the object 52 before the second inspection step.

The heat-radiating terminal 24 may heat up to a high temperature, e.g., when it is continuously used for inspection. In the inspection apparatus and the inspection method of the second embodiment, however, the heated heat-radiating terminal 24 is replaced with the replacement heat-radiating terminal 72, and the inspection can be quickly resumed after the replacement. This eliminates the need to wait until the heated heat-radiating terminal 24 has been adequately cooled, resulting in rapid inspection.

Figure 9:
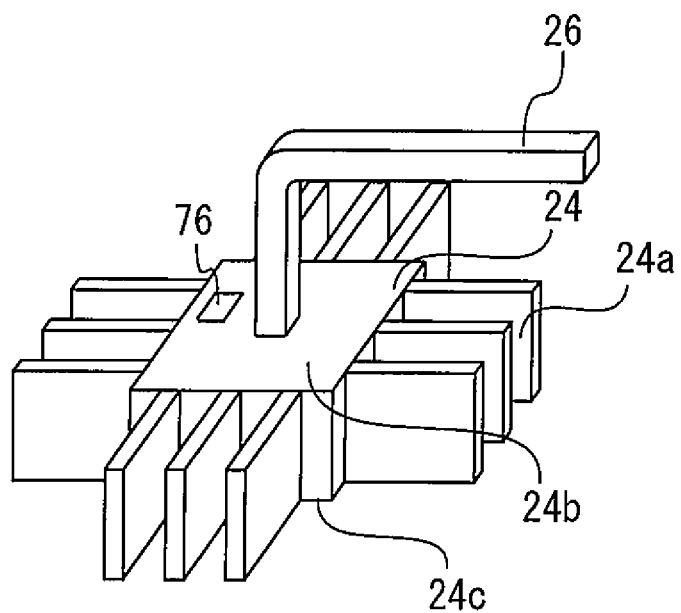
FIG. 9 is a perspective view of a variation of the inspection apparatus of the second embodiment.

Various alterations may be made to the inspection apparatus and the inspection method of the second embodiment. FIG. 9 is a perspective view of a variation of the inspection apparatus of the second embodiment. The heat-radiating terminal 24 has a temperature sensor 76 attached thereto. The signal from the temperature sensor 76 is sent to the control unit 40, e.g., by using a radio wave signal, and the control unit 90 monitors the temperature of the heat-radiating terminal 24. When the heat-radiating terminal 24 has reached a predetermined temperature, the control unit 40 controls the first arm 30 so as to replace the heat-radiating terminal 24. As a result, it is always possible to use a heat-radiating terminal at a temperature not exceeding the predetermined temperature.

In addition to the above alteration, the inspection apparatus and the inspection method of the second embodiment are susceptible of alterations at least similar to those that can be made to the inspection apparatus and the inspection method of the first embodiment.

Third Embodiment

A third embodiment of the present invention provides an inspection apparatus and an inspection method which have many features common to the inspection apparatus and the inspection method of the first embodiment. Therefore, the following description of the third embodiment will be primarily limited to the differences from the first embodiment. The inspection apparatus of the third embodiment is characterized by having a plurality of probe pins, each provided with a heat-radiating terminal.

Figure 10:
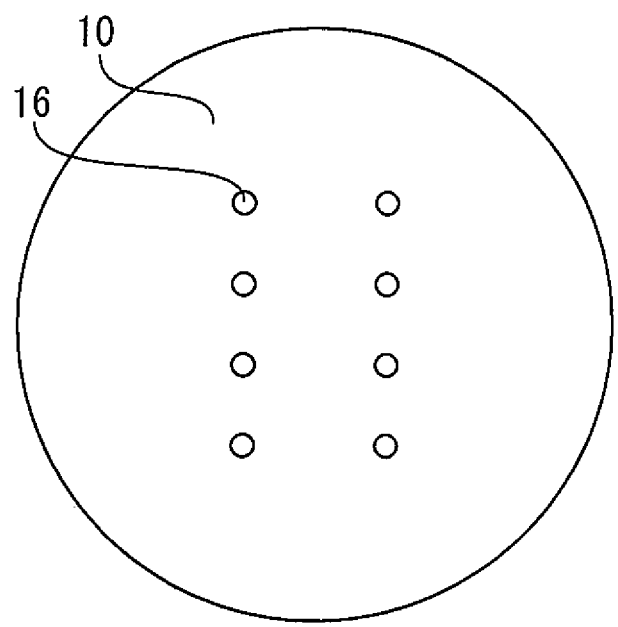
FIG. 10 is a bottom view of the insulating substrate and the probe pins of the third embodiment.
Figure 11:
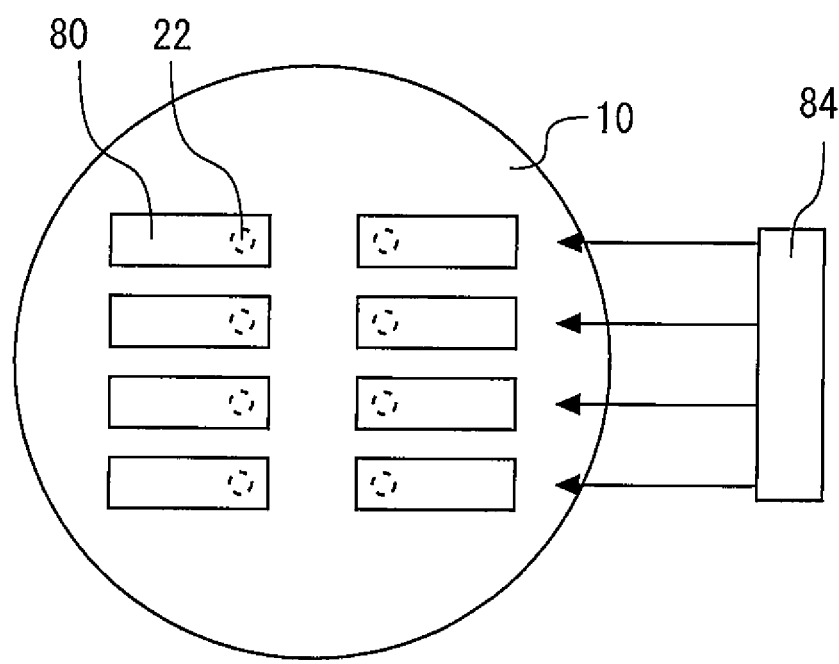
FIG. 11 is a plan view of the heat-radiating terminals, the insulating substrate, etc. of the third embodiment.
Figure 12:
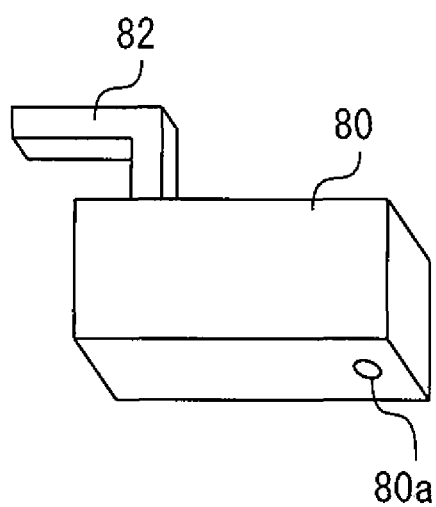
FIG. 12 is a perspective view of one of the heat-radiating terminals of the third embodiment.

FIG. 10 is a bottom view of the insulating substrate and the probe pins of the third embodiment. As shown, the insulating substrate 10 is provided with 8 probe pins. FIG. 11 is a plan view of the heat-radiating terminals, the insulating substrate, etc. of the third embodiment. Each of a plurality of connection portions 22, indicated by dashed lines, is in contact with one of the heat-radiating terminals 80. A blower 89 is provided at a position where it can blow air against the heat-radiating terminals 80. FIG. 12 is a perspective view of one of the heat-radiating terminals (80) of the third embodiment. As shown, each heat-radiating terminal 80 has formed in its lower surface a recessed portion 80a into which one of the connection portions 22 is inserted. A current carrying member 82 is secured to the upper surface of each heat-radiating terminal 80.

In the inspection apparatus of the third embodiment, the plurality of heat-radiating terminals 80 can be cooled by means of the blower 84. In certain cases particularly where the heat-radiating terminals 80 are disposed close to one another, the air between them heats up, which may degrade the heat-radiating function of the heat-radiating terminals 80. In that case, the blower 84 may be provided at a position where it can supply air to the space between the heat-radiating terminals.

When the object to be measured is a power semiconductor device such as an IGBT, it may be necessary to apply a current of a few hundreds of amperes to the object. In such cases, a plurality of probe pins are brought into contact with the surface pad of the object to be measured, which requires that the probe pins be spaced in close proximity to one another. If heat-radiating terminals such as those described above are used in such conditions, care must be taken so that the heat-radiating terminals do not come into contact with each other. In the inspection apparatus of the third embodiment, unlike that of the first embodiment, each connection portion 22 is in contact with a "corner" of the lower surface of one of the heat-radiating terminals 80. Furthermore, the heat-radiating terminals 80 are configured as blocks. This makes it possible to provide substantial space between the heat-radiating terminals and thereby prevent contact between them.

It should be noted that the inspection apparatus and the inspection method of the third embodiment are susceptible of alterations at least similar to those that can be made to the inspection apparatus and the inspection method of the first embodiment.

The features and advantages of the present invention may be summarized as follows.

In accordance with the present invention, a heat-radiating terminal which is in contact with the probe pin is provided on the current path for inspection, making it possible to easily prevent the expansion and warpage of the insulating substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-127192, filed on Jun. 4, 2012 including specification, claims, drawings and summary, on which the Convention priority of the present application is based, are incorporated herein by reference in its entirety.

What is claimed is:

1. An inspection apparatus comprising:
    an insulating substrate;
    a probe pin having a body portion secured to said insulating substrate, a tip portion connected to one end of said body portion and disposed on the back surface side of said insulating substrate, and a connection portion connected to the other end of said body portion and disposed on the front surface side of said insulating substrate; and
    a heat-radiating terminal in contact with said connection portion;
    wherein a current is applied through said heat-radiating terminal and said probe pin to an object to measured; and
    wherein said heat-radiating terminal discharges heat from said probe pin.

2. The inspection apparatus according to claim 1, wherein said heat-radiating terminal has a larger volume than said probe pin.

3. The inspection apparatus according to claim 1, wherein said heat-radiating terminal is formed of metal material and has a recessed portion or a radiating fin.

4. The inspection apparatus according to claim 1, wherein the portion of said tip portion which is brought into contact with said object to be measured is rounded.

5. The inspection apparatus according to claim 1, wherein said heat-radiating terminal has an upper surface and a lower surface, and a current flows from a center portion of said upper surface to a center portion of said lower surface.

6. The inspection apparatus according to claim 1, wherein said heat-radiating terminal has a recessed portion formed therein, and the shape of said connection portion is such that said connection portion can be inserted into said recessed portion.

7. The inspection apparatus according to claim 1, further comprising a plurality of said probe pins, a plurality of said heat-radiating terminals, and a blower for cooling said plurality of heat-radiating terminals.

8. The inspection apparatus according to claim 1, further comprising:
   an arm for holding and moving said heat-radiating terminal; and
   a control unit for applying a current through said arm to said heat-radiating terminal and controlling said arm so that said heat-radiating terminal and said connection portion are brought into and out of contact with each other.

9. The inspection apparatus according to claim 8, wherein said control unit controls said arm so as to replace said heat-radiating terminal with a replacement heat-radiating terminal.

10. A method of inspection comprising:
    a first preparation step of bringing a tip portion of a probe pin into contact with a first object to be measured and bringing a heat-radiating terminal into contact with a connection portion of said probe pin, said probe pin having a body portion secured to an insulating substrate, said tip portion being connected to one end of said body portion and disposed on the back surface side of said insulating substrate, said connection portion being connected to the other end of said body portion and disposed on the front surface side of said insulating substrate;
    a first inspection step of, after said first preparation step, inspecting electrical characteristics of said first object to be measured by applying a current to said first object through said probe pin and said heat-radiating terminal while heating said first object;
    a separation step of, after said first inspection step, separating said tip portion from said first object to be measured and separating said heat-radiating terminal from said connection portion so as to cool said heat-radiating terminal;
    a second preparation step of, after said separation step, bringing said tip portion into contact with said first object to be measured or a second object to be measured and bringing said heat-radiating terminal into contact with said connection portion; and
    a second inspection step of, after said second preparation step, inspecting electrical characteristics of said first or second object to be measured by applying a current to said first or second object through said probe pin and said heat-radiating terminal while heating said first or second object.

11. A method of inspection comprising:
    a preparation step of bringing a tip portion of a probe pin into contact with a first object to be measured and bringing a heat-radiating terminal into contact with a connection portion of said probe pin, said probe pin having a body portion secured to an insulating substrate, said tip portion being connected to one end of said body portion and disposed on the back surface side of said insulating substrate, said connection portion being connected to the other end of said body portion and disposed on the front surface side of said insulating substrate;
    a first inspection step of, after said preparation step, inspecting electrical characteristics of said first object to be measured by applying a current to said first object through said probe pin and said heat-radiating terminal while heating said first object;
    a replacement step of, after said first inspection step, replacing said heat-radiating terminal with a replacement heat-radiating terminal; and
    a second inspection step of, after said replacement step, inspecting electrical characteristics of said first object to be measured or a second object to be measured by applying a current to said first or second object through said probe pin and said replacement heat-radiating terminal while heating said first or second object.

12. The method according to claim 11, wherein when a temperature sensor attached to said heat-radiating terminal has reached a predetermined temperature, said method proceeds from said first inspection step to said replacement step.

* * * * *